US012796043B2

(12) United States Patent
Ghosh et al.

(10) Patent No.: US 12,796,043 B2
(45) Date of Patent: Nov. 10, 2026

(54) DIELECTRIC LAYER STACK FOR WIDE GATE CUT STRUCTURES

(71) Applicant: Intel Corporation, Santa Clara, CA (US)

(72) Inventors: Swapnadip Ghosh, Hillsboro, OR (US); Yulia Gotlib, Hillsboro, OR (US); Matthew J. Prince, Portland, OR (US); Alison V. Davis, Portland, OR (US); Chun Chen Kuo, Portland, OR (US); Andrew Arnold, Hillsboro, OR (US); Cun Wen, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 67 days.

(21) Appl. No.: 18/083,064

(22) Filed: Dec. 16, 2022

(65) Prior Publication Data

US 2024/0203739 A1 Jun. 20, 2024

(51) Int. Cl.

| | |
|---|---|
| ***H10D 84/83*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 64/66*** | (2025.01) |

(52) U.S. Cl.

CPC ..... *H10D 64/01326* (2026.01); *H10D 30/014* (2025.01); *H10D 30/43* (2025.01); *H10D 30/6735* (2025.01); *H10D 62/121* (2025.01); *H10D 64/671* (2025.01)

(58) Field of Classification Search

CPC ..................................................... H10D 84/834

See application file for complete search history.

(56) References Cited

U.S. PATENT DOCUMENTS

| | | | | |
|---|---|---|---|---|
| 2009/0104789 | A1* | 4/2009 | Mallick | C23C 16/045 257/E21.24 |
| 2019/0267374 | A1* | 8/2019 | Hung | H10D 84/0151 |
| 2019/0355717 | A1* | 11/2019 | Zhou | H10D 30/025 |
| 2020/0135580 | A1* | 4/2020 | Hsieh | H10D 84/0151 |
| 2024/0194696 | A1* | 6/2024 | Kane | H10D 86/441 |

* cited by examiner

*Primary Examiner* — Christopher A Johnson

(74) *Attorney, Agent, or Firm* — Arcane Law PLLC

(57) ABSTRACT

Techniques are provided herein to form semiconductor devices that include one or more wide gate cuts having a multi-layer dielectric structure. A semiconductor device includes a gate structure around or otherwise on a semiconductor region. The gate structure may be interrupted, by any number of gate cuts that extend through an entire thickness of the gate structure and which include dielectric material. Some of the gate cuts may be at least 2× wider than others. Such wide gate cuts may include a first dielectric layer with a first material composition, a second dielectric layer on the first dielectric layer with a second material composition elementally different from the first material composition, a third dielectric layer on the second dielectric layer with a greater density than the second dielectric layer, and a dielectric fill within a remaining volume of the wide gate cut and on the third dielectric layer.

20 Claims, 12 Drawing Sheets

DIELECTRIC LAYER STACK FOR WIDE GATE CUT STRUCTURES

FIELD OF THE DISCLOSURE

The present disclosure relates to integrated circuits, and more particularly, to metal gate cut structures made in semiconductor devices.

BACKGROUND

As integrated circuits continue to scale downward in size, a number of challenges arise. For instance, reducing the size of memory and logic cells is becoming increasingly more difficult, as is reducing device spacing at the device layer. As transistors are packed more densely, the formation of certain device structures used to isolate adjacent transistors becomes challenging. Accordingly, there remain a number of non-trivial challenges with respect to forming semiconductor devices.

Figure 1A:
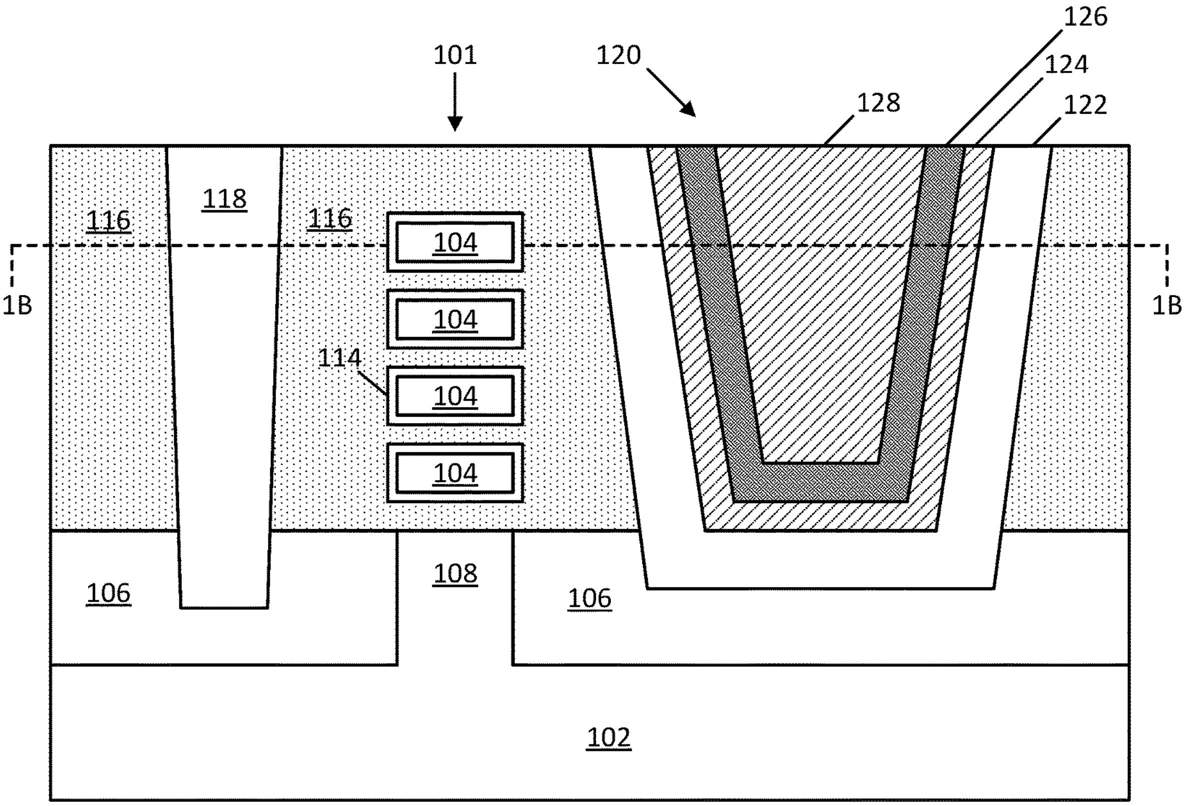
FIGS. 1A and 1B are cross-sectional and plan views, respectively, of some semiconductor devices that illustrate a wide gate cut having a multi-layer dielectric structure, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form semiconductor devices that include one or more wide gate cuts having a multi-layer dielectric structure. The techniques can be used in any number of integrated circuit applications and are particularly useful with respect to device layer transistors, such as finFETs or gate-all-around transistors (e.g., ribbonFETs and nanowire FETs). In an example, a semiconductor device includes a gate structure around or otherwise on a semiconductor region. The semiconductor region can be, for example, a fin of semiconductor material that extends from a source region to a drain region, or one or more nanowires or nanoribbons or nanosheets of semiconductor material that extend from a source region to a drain region. The gate structure includes a gate dielectric (e.g., high-k gate dielectric material) and a gate electrode (e.g., conductive material such as workfunction material and/or gate fill metal). The gate structure may be interrupted, for example, between two transistors with any number of gate cuts that extend through an entire thickness of the gate structure and which include dielectric material. Some of the gate cuts may be wider than others. For example, one or more of the gate cuts may have a height-to-width aspect ratio between 1:1 and 3:1, while one or more narrower gate cuts have a height-to-width aspect ratio between 5:1, 8:1, or higher. Even wider gate cuts, such as those having height-to-width aspect ratios between 1:1 and 1:3 or wider, may also be used. Such wide gate cuts may be formed of a stack of dielectric materials to maintain the integrity of the structure. In some embodiments, a wide gate cut may include a first dielectric layer with a first material composition, a second dielectric layer on the first dielectric layer with a second material composition elementally different from the first material composition, a third dielectric layer on the second dielectric layer with a greater density than the second dielectric layer, and a dielectric fill within a remaining volume of the wide gate cut and on the third dielectric layer. Numerous variations and embodiments will be apparent in light of this disclosure.

General Overview

As previously noted above, there remain a number of non-trivial challenges with respect to integrated circuit fabrication. In more detail, as devices become smaller and more densely packed, many structures become more challenging to fabricate as critical dimensions (CD) of the structures push the limits of current fabrication technology. Example structures like gate cuts may be used for a variety of purposes in integrated circuit design. For example, some narrow gate cuts with height-to-width ratios greater than about 1:5 may be used to isolate gate structures from one another between different semiconductor devices. However, other wider gate cuts with height-to-width ratios between about 3:1 and about 1:1 (or lower, such as 1:2) may be used as lithography markers or to separate cells from one another. The formation of both types of gate cuts with highly disparate critical dimensions (e.g., widths) is challenging as techniques used to fill the narrower gate cuts with dielectric material may fail to adequately fill the wider gate cuts. Attempting to fill the wider gate cuts with additional dielectric material can lead to issues with sagging and pooling of conductive material over the wider gate cuts, which can cause shorts.

Thus, and in accordance with an embodiment of the present disclosure, techniques are provided herein to form both narrow and wide gate cuts (which may more generally be referred to as dielectric structures) that alleviate the issues noted above. In some embodiments, a first dielectric layer may be used to form the narrow gate cut and the first layer of the wider gate cut, via atomic layer deposition (ALD). Afterwards, a second dielectric layer is formed over the first dielectric layer to form another part of the wider gate cut, via chemical vapor deposition (CVD). The second dielectric layer may have an elementally different material composition than the first dielectric layer. For example, the first dielectric layer may be silicon nitride while the second dielectric layer may be silicon carbide. Next, a third dielectric layer is formed over the second dielectric layer via CVD with a high density plasma to form a highly conformal and dense layer compared to the second dielectric layer. The remaining volume of the wide gate cut may be a dielectric fill formed on the third dielectric layer, via CVD. In some examples, the dielectric fill has the same material composition as the second and third dielectric layers (e.g., silicon carbide).

Using the sandwich approach of provide different dielectric layers in the wide gate cuts allows for both narrow and wide gate cuts to be formed together, as the first dielectric layer of the wide gate cut can be used to form the entirety of, or almost the entirety of, the narrow gate cut. Then, successive dielectric layers within the wide gate cut can be tailored to ensure that the wide gate cut is fully filled and has a substantially level top surface to avoid unwanted metal pooling.

According to an embodiment, an integrated circuit includes a semiconductor device having a semiconductor region extending in a first direction from a source region to a drain region, and a first gate structure extending in a second direction over the semiconductor region, and a dielectric structure extending in a third direction through at least an entire thickness of the gate structure. The dielectric structure includes a first dielectric layer along edges of the dielectric structure and having a first material composition, a second dielectric layer on the first dielectric layer and having a second material composition elementally different from the first material composition, a third dielectric layer on the second dielectric layer and having a greater density than the second dielectric layer, and a dielectric fill within a remaining volume of the dielectric structure and on the third dielectric layer.

According to an embodiment, an integrated circuit includes one or more semiconductor regions extending in a first direction between corresponding source or drain regions, a gate structure extending in a second direction over the one or more semiconductor regions, a gate cut extending in a third direction through an entire thickness of the gate structure, and a dielectric structure extending in the third direction through at least the entire thickness of the gate structure. The gate cut has a first width at a top surface of the gate cut, and the dielectric structure has a second width at a top surface of the dielectric structure that is two times or more greater than the first width. The dielectric structure includes a first dielectric layer along edges of the dielectric structure, a second dielectric layer on the first dielectric layer, a third dielectric layer on the second dielectric layer, and a dielectric fill within a remaining volume of the dielectric structure and on the third dielectric layer. The third dielectric layer has a greater density compared to both the second dielectric layer and the dielectric fill. The first dielectric layer may include a dielectric material (e.g., silicon nitride) that may also make up or otherwise be included in the gate cut. In some such cases, the dielectric material makes up the bulk of the gate cut (e.g., 90% or more of the gate cut is the same dielectric material of the first dielectric layer).

According to another embodiment, a method of forming an integrated circuit includes forming a fin comprising semiconductor material, the fin extending above a substrate and extending in a first direction; forming a gate electrode extending over the semiconductor material in a second direction different from the first direction; forming a recess through an entire thickness of the gate electrode and adjacent to the fin; forming a first dielectric layer within the recess, the first dielectric layer having a first material composition; forming a second dielectric layer on the first dielectric layer, the second dielectric layer having a second material composition different from the first material composition; forming a third dielectric layer on the second dielectric layer, the third dielectric layer having a greater density than the second dielectric layer, and forming a dielectric fill within a remaining volume of the recess and on the third dielectric layer. ALD and CVD deposition techniques can be used to provide the various layers, to provide quality fill that avoids metal pooling on the top of the structure that includes the first, second and third dielectric layers.

The techniques can be used with any type of non-planar transistors, including finFETs (sometimes called tri-gate transistors), nanowire and nanoribbon transistors (sometimes called gate-all-around transistors), or forksheet transistors, to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, such tools may indicate the presence of gate cuts having different widths, where the wider gate cuts are formed from multiple dielectric layers, including at least one layer with a higher density compared to its adjacent layers. In one example, such tools may be used to observe a first dielectric layer formed via ALD, a second dielectric layer formed via CVD, a third dielectric layer formed via flowable CVD, and a fourth dielectric layer or fill formed via CVD. In some embodiments, such tools may indicate a highly planar top surface of the wider gate cut with no visible evidence of metal pooling on the wider gate cut. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

Figure 1B:
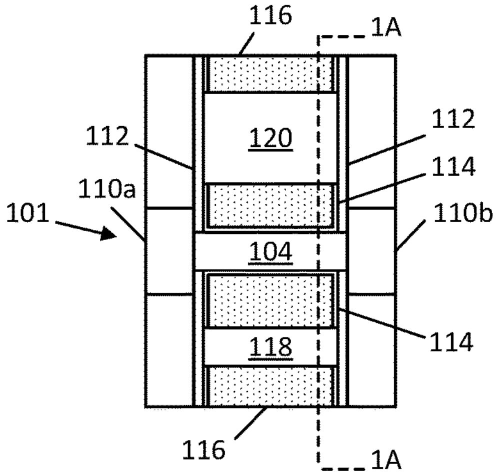

FIG. 1A is a cross-section view taken across an example semiconductor device 101, and some adjacent gate cuts according to an embodiment of the present disclosure. FIG. 1B is a top-down cross-section view of the structure taken across the dashed line 1B-1B depicted in FIG. 1A, and FIG. 1A illustrates the cross-section taken across the dashed line 1A-1A depicted in FIG. 1B. It should be noted that some of the material layers (such as each of the different dielectric layers that make up wide gate cut 120) in the top-down view of FIG. 1B have been omitted for clarity. Semiconductor device 101 may be a non-planar metal oxide semiconductor (MOS) transistor, such as a tri-gate (e.g., finFET) or gate-all-around (GAA) transistor, although other transistor topologies and types could also benefit from the techniques provided herein. The illustrated embodiments herein use the GAA structure, but other gate structures can also benefit such as planar gate structures, double-gate structures, and tri-gate structures. Semiconductor device 101 represents a portion of an integrated circuit that may contain any number of similar semiconductor devices and gate cuts.

As can be seen, semiconductor device 101 is formed on a substrate 102. Any number of semiconductor devices can be formed on substrate 102, but one is used here as an example. Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 102 can be a semiconductor-on-insulator substrate having a desired semiconductor layer over a buried insulator layer (e.g., silicon over silicon dioxide). Alternatively, substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used. In some example embodiments, a lower portion of (or all of) substrate 102 is removed and replaced with one or more backside interconnect layers to form backside signal and power routing.

Semiconductor device 101 includes one or more nanoribbons 104 that extend parallel to one another along a direction between a source region and a drain region (e.g., a first direction into and out of the page in the cross-section view of FIG. 1A). Nanoribbons 104 are one example of semiconductor regions or semiconductor bodies that extend between source and drain regions. The term nanoribbon may also encompass other similar shapes such as nanowires or nanosheets. The semiconductor material of nanoribbons 104 may be formed from substrate 102. In some embodiments, semiconductor device 101 may include a semiconductor region in the shape of a fin that can be, for example, native to substrate 102 (formed from the substrate itself), such as a silicon fin etched from a bulk silicon substrate. Alternatively, any number of fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 104 during a gate forming process where one type of the alternating layers is selectively etched away so as to liberate the other type of alternating layers within the channel region, so that a gate-all-around (GAA) process can then be carried out. Again, the alternating layers can be blanket deposited and then etched into fins or deposited into fin-shaped trenches, according to some examples.

As can further be seen, a dielectric fill 106 may be used around a base of semiconductor device 101. Dielectric fill 106 provides shallow trench isolation (STI) between any adjacent semiconductor devices, and adjacent subfin regions 108. Dielectric fill 106 can be any suitable dielectric material, such as silicon dioxide, aluminum oxide, or silicon oxycarbonitride.

Semiconductor device 101 may include a subfin region 108. According to some embodiments, subfin region 108 comprises the same semiconductor material as substrate 102 and is adjacent to dielectric fill 106. According to some embodiments, nanoribbons 104 (or other semiconductor bodies) extend between a source and a drain region in the first direction to provide an active region for a transistor (e.g., the semiconductor region beneath the gate). The source and drain regions are not shown in the cross-section of FIG. 1A, but are seen in the top-down view of FIG. 1B where nanoribbons 104 of semiconductor device 101 extend between a source region 110*a* and a drain region 110*b*. FIG. 1B also illustrates spacer structures 112 that extend around the ends of nanoribbons 104 and along sidewalls of the gate structures between spacer structures 112. Spacer structures 112 may include a dielectric material, such as silicon nitride.

According to some embodiments, the source and drain regions are epitaxial regions that are provided using an etch-and-replace process. In other embodiments one or both of the source and drain regions could be, for example, implantation-doped native portions of the semiconductor fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

According to some embodiments, a gate structure extends over nanoribbons 104 of semiconductor device 101 along a second direction across the page. The second direction may be orthogonal to the first direction. The gate structure includes a gate dielectric 114 and a gate layer (or gate electrode) 116. Gate dielectric 114 represents any number of dielectric layers present between nanoribbons 104 and gate layer 116. Gate dielectric 114 may also be present on the surfaces of other structures within the gate trench, such as on subfin region 108. As seen in FIG. 1B, gate dielectric 114 may form on the inner surfaces of spacer structures 112 and around all surfaces of nanoribbons 104. Gate dielectric 114 may include any suitable gate dielectric material(s). In some embodiments, gate dielectric 114 includes a layer of native oxide material (e.g., silicon dioxide) on the nanoribbons or other semiconductor regions making up the channel region of the devices, and a layer of high-K dielectric material (e.g., hafnium oxide) on the native oxide.

Gate layer 116 may represent any number of conductive layers, such as any metal, metal alloy, or doped polysilicon layers. In some embodiments, gate layer 116 includes one or more workfunction metals around nanoribbons 104. In some embodiments, semiconductor device 101 is a p-channel device that includes a workfunction metal having titanium around its nanoribbons 104. In some embodiments, semiconductor device 101 is an n-channel device that includes a workfunction metal having tungsten around its nanoribbons 104. Gate layer 116 may also include a fill metal or other conductive material (e.g., tungsten, ruthenium, molybdenum, copper, aluminum) around the workfunction metals to provide the whole gate electrode structure.

According to some embodiments, the gate structure may be interrupted along the second direction (e.g., across the page) by a gate cut 118, which acts like a dielectric barrier or wall between gate structures. Gate cut 118 extends vertically (e.g., in a third direction) through at least an entire thickness of the adjacent gate structure. In some embodiments, gate cut 118 also extends through an entire thickness of dielectric fill 106. According to some embodiments, the gate structure may also be interrupted by a wide gate cut 120 that has a greater width at its top surface along the second direction compared to a width of gate cut 118 at its top surface along the second direction. In some examples, gate cut 118 has a width at its top surface between about 10 nm and about 30 nm, and wide gate cut 120 has a width at its top surface between about 180 nm and about 260 nm. In some examples, the maximum width of wide gate cut 120 is at least two times or more wider than the maximum width of gate cut 118. In some such embodiments, the maximum width of wide gate cut 120 is at least four to six times wider than the maximum width of gate cut 118. Wide gate cut 120 may have a height-to-width ratio between about 1:1 and about 3:1, in some examples. Wide gate cut 120 may have an even wider geometry with a height-to-width aspect ratio between 1:1 and 1:3, in still other examples. More generally, and as further described below, gate 118 may have a maximum width that is substantially filled with an ALD layer of thickness X, and wide gate cut 120 may have a maximum width that includes a first layer of thickness X in addition to the thicknesses of several more layers (e.g., layers 2 through 4). Since both gate cut 118 and wide gate cut 120 are formed through the gate structure, gate dielectric 114 does not form along any sidewall surfaces of gate cut 118 or wide gate cut 120 as seen in FIG. 1B.

According to some embodiments, wide gate cut 120 includes a dielectric layer stack having multiple distinctly formed dielectric layers. Wide gate cut 120 may include a first dielectric layer 122 having a first material composition. First dielectric layer may be the same material used to form gate cut 118. In some embodiments, first dielectric layer 122 is formed to a thickness between about 50 nm and about 80 nm, such as around 65 nm, using ALD. First dielectric layer 122 may be a high-k material (e.g., a material with a dielectric constant of at least 6.5), such as silicon nitride. In some examples, first dielectric layer 122 includes amorphous silicon deposited using ALD.

Wide gate cut 120 includes a second dielectric layer 124 on first dielectric layer 122. Second dielectric layer 124 may be formed using CVD to a thickness between about 10 nm and about 30 nm. According to some embodiments, second dielectric layer 124 has a different material composition compared to first dielectric layer 122. For example, first dielectric layer 122 may be silicon nitride while second dielectric layer 124 may be silicon carbide. In some other embodiments, second dielectric layer 124 includes silicon nitride deposited using plasma enhanced chemical vapor deposition (PECVD).

Wide gate cut 120 includes a third dielectric layer 126 on second dielectric layer 124. According to some embodiments, third dielectric layer 126 is formed using a flowable CVD process with a high-density plasma to form a very dense and conformal layer. As a result, third dielectric layer 126 may have the same material composition as second dielectric layer 124 (e.g., silicon carbide) but may further have a higher density compared to second dielectric layer 124. Third dielectric layer may have a thickness between about 40 nm and about 60 nm, in some examples.

The remaining volume of wide gate cut 120 (after first dielectric layer 122, second dielectric layer 124, and third dielectric layer 126), may include a dielectric fill 128, according to some embodiments. Dielectric fill 128 may have the same material composition as second dielectric layer 124 (e.g., silicon carbide) and be formed using CVD. In some other examples, dielectric fill 128 includes silicon nitride deposited using PECVD. Due to the multi-layer formation process, the top surface of wide gate cut 120 (and more specifically of dielectric fill 128), is substantially level with a top surface of gate structure 116 with no significant drooping that would trap metal within the drooped area, according to some embodiments.

Gate cut 118 and wide gate cut 120 may each extend in the first direction as seen in FIG. 1B such that they cut across at least the entire width of the gate trench. According to some embodiments, either or both gate cut 118 and wide gate cut 120 may also extend further past spacer structures 112. In some examples, either or both gate cut 118 and wide gate cut 120 extends across more than one gate trench in the first direction (e.g., cutting through more than one gate structure running parallel along the second direction).

Fabrication Methodology

FIGS. 2A-2L include cross-sectional views that collectively illustrate an example process for forming an integrated circuit with one or more semiconductor devices and one or more wide gate cuts having a multi-layer dielectric structure, in accordance with an embodiment of the present disclosure. Each figure shows an example structure that results from the process flow up to that point in time, so the depicted structure evolves as the process flow continues, culminating in the structure shown in FIG. 2L, which is similar to the structure shown in FIG. 1A. The illustrated integrated circuit structure may be part of a larger integrated circuit that includes other integrated circuitry not depicted. Example materials and process parameters are given, but the present disclosure is not intended to be limited to any specific such materials or parameters, as will be appreciated. Although the fabrication of a single semiconductor device along with a single wide gate cut is illustrated in the aforementioned figures, it should be understood that any number of similar semiconductor devices and wide gate cuts can be fabricated across the integrated circuit using the same processes discussed herein.

Figure 2A:
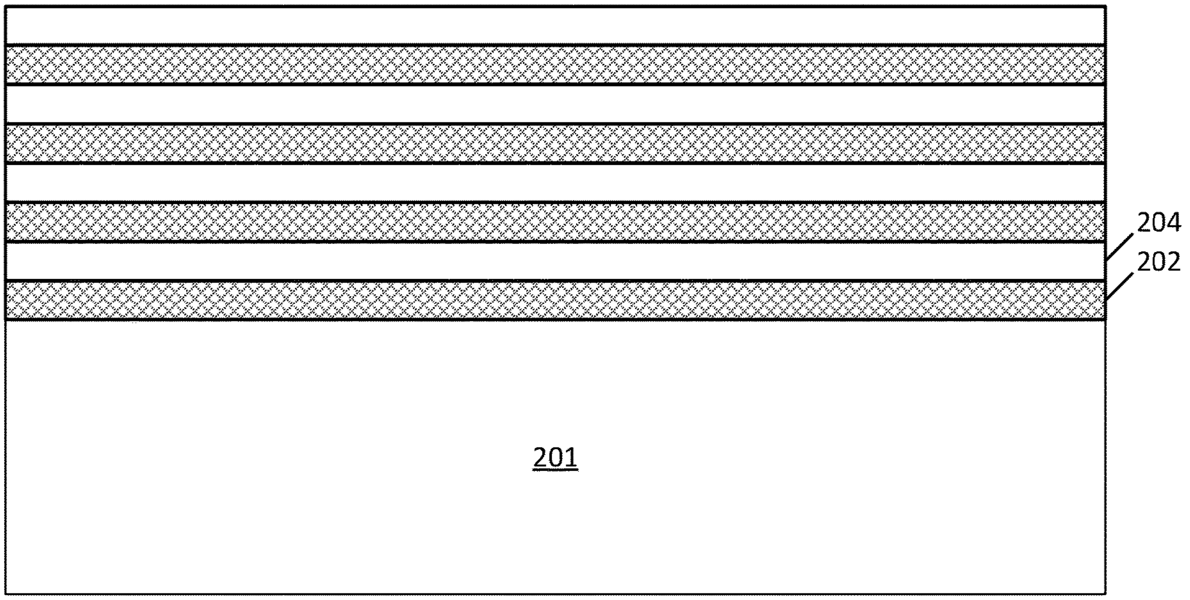
FIGS. 2A-2L are cross-sectional views that illustrate various stages in an example process for forming semiconductor devices that have a wide gate cut with a multi-layer dielectric structure, in accordance with some embodiments of the present disclosure.

FIG. 2A illustrates a cross-sectional view taken through a substrate 201 having a series of material layers formed over the substrate, according to an embodiment of the present disclosure. Alternating material layers may be deposited over substrate 201 including sacrificial layers 202 alternating with semiconductor layers 204. The alternating layers are used to form GAA transistor structures. Any number of alternating semiconductor layers 204 and sacrificial layers 202 may be deposited over substrate 201. The description above for substrate 102 applies equally to substrate 201.

According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. In some examples, semiconductor layers 204 may be doped with either n-type dopants (to produce a p-channel transistor) or p-type dopants (to produce an n-channel transistor).

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm). The thickness of each of semiconductor layers 204 may be about the same as the thickness of each sacrificial layer 202 (e.g., about 5-20 nm). Each of sacrificial layers 202 and semiconductor layers 204 may be deposited using any known or proprietary material deposition technique, such as chemical vapor deposition (CVD), plasma-enhanced chemical vapor deposition (PECVD), physical vapor deposition (PVD), or atomic layer deposition (ALD).

Figure 2B:
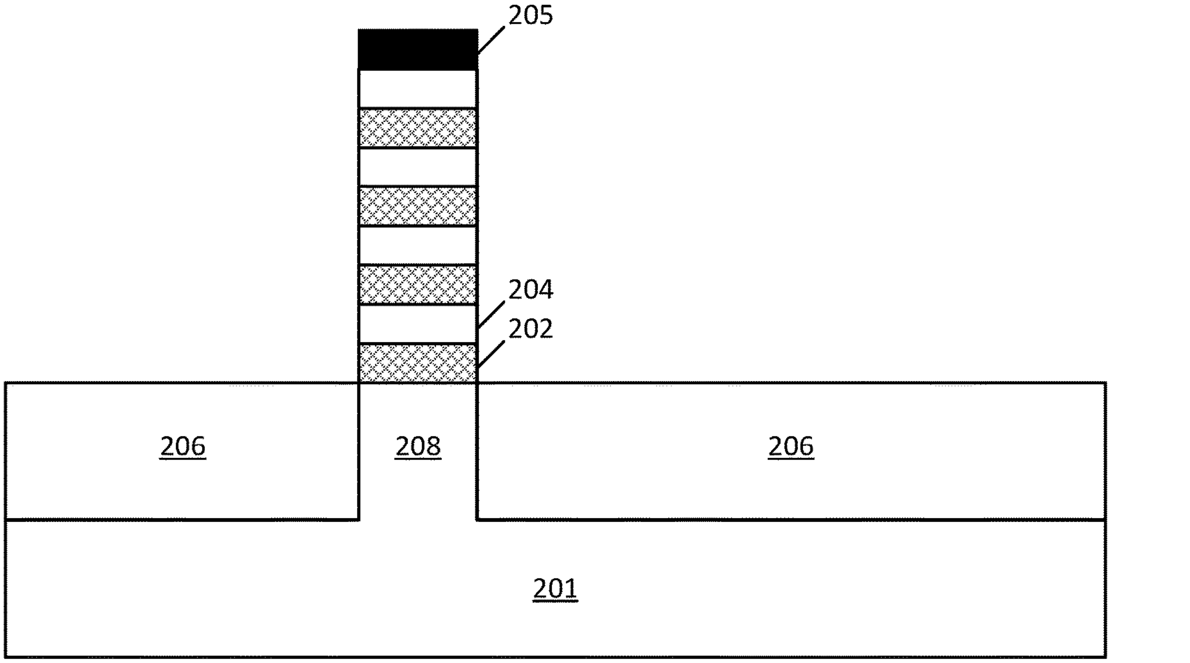

FIG. 2B depicts the cross-section view of the structure shown in FIG. 2A following the formation of a cap layer 205 and the subsequent formation of a fin beneath cap layer 205, according to an embodiment. Cap layer 205 may be any suitable hard mask material such as a carbon hard mask (CHM) or silicon nitride. Cap layer 205 may be patterned into rows to form corresponding rows of fins from the alternating layer stack of sacrificial layers 202 and semiconductor layers 204. Although only fin is illustrated here, rows of fins may be formed beneath corresponding cap layers 205 and extend lengthwise in a first direction (e.g., into and out of the page).

According to some embodiments, an anisotropic etching process through the layer stack continues into at least a portion of substrate 201. The etched portion of substrate 201 may be filled with a dielectric fill 206 that acts as shallow trench isolation (STI) between adjacent fins. Dielectric fill 206 may be any suitable dielectric material such as silicon dioxide. Subfin regions 208 represent remaining portions of substrate 201 between dielectric fill 206, according to some embodiments.

Figure 2C:
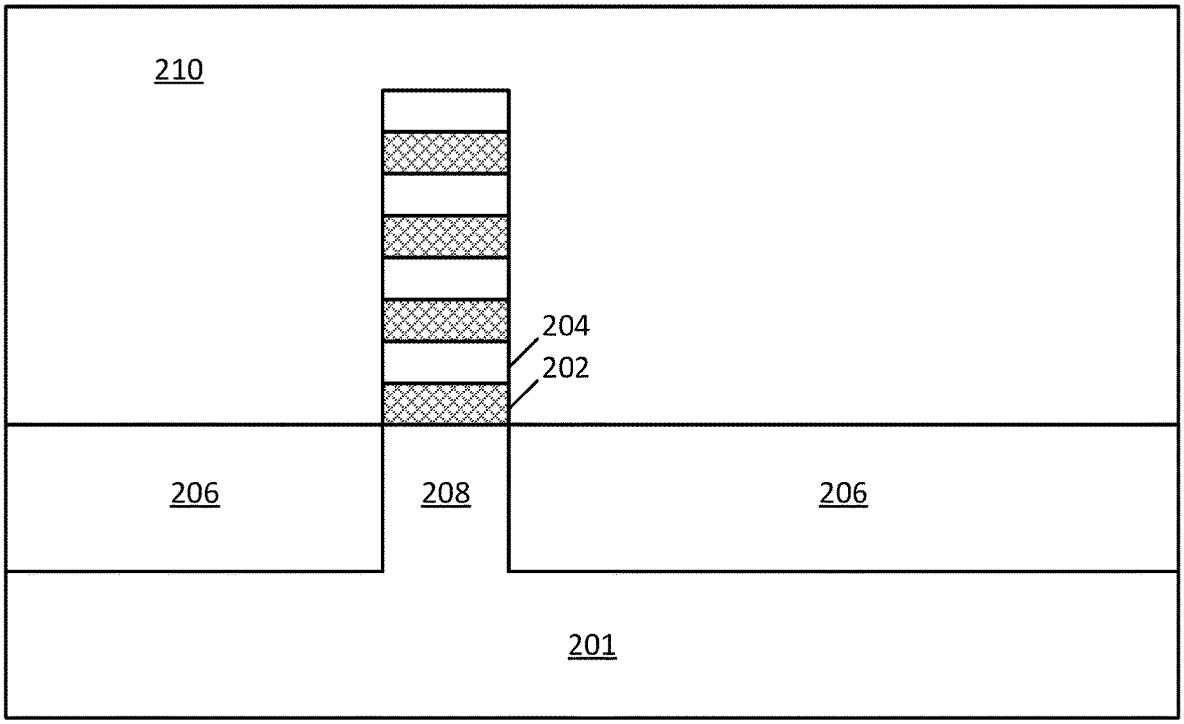

FIG. 2C depicts the cross-section view of the structure shown in FIG. 2B following the formation of a sacrificial gate 210 extending across the fin in a second direction different from the first direction, according to some embodiments. Sacrificial gate 210 may extend across the fin in a second direction that is orthogonal to the first direction. According to some embodiments, the sacrificial gate material is formed in parallel strips across the integrated circuit and removed in all areas not protected by a gate masking layer. Sacrificial gate 210 may be any suitable material that can be selectively removed without damaging the semiconductor material of the fin. In some examples, sacrificial gate 210 includes polysilicon. In some cases, sacrificial gate 210 may also include a gate dielectric, such as an oxide of the fin material.

Following the formation of sacrificial gate 210 (and prior to replacement of sacrificial gate 210 with a metal gate), additional semiconductor device structures are formed that are not shown in these cross-sections. These additional structures include spacer structures on the sidewalls of sacrificial gate 210 and source and drain regions on either ends of the fin. The formation of such structures can be accomplished using any number of processing techniques.

Figure 2D:
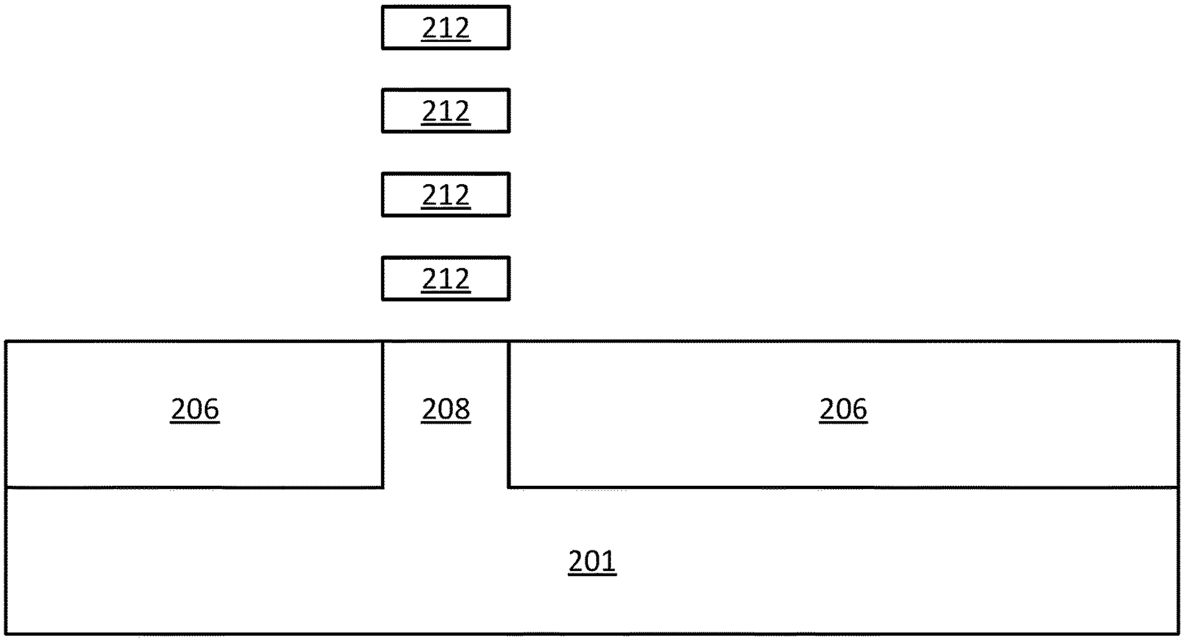

FIG. 2D depicts the cross-section view of the structure shown in FIG. 2C following the removal of sacrificial gate 210 and the removal of sacrificial layers 202, according to some embodiments. In examples where any gate masking layers are still present, they may also be removed at this time. Once sacrificial gate 210 is removed, the fin that had been beneath sacrificial gate 210 is exposed.

In the example where the fin includes alternating semiconductor layers, sacrificial layers 202 are selectively removed to release nanoribbons 212 that extend between corresponding source or drain regions. The vertical set of nanoribbons 212 represents the semiconductor or channel region of one semiconductor device. Accordingly, any number of other semiconductor devices may be formed from their own corresponding vertical set of nanoribbons. It should be understood that nanoribbons 212 may also be nanowires or nanosheets (e.g., from a forksheet arrangement) or fins (e.g., for a finFET arrangement). Sacrificial gate 210 and sacrificial layers 202 may be removed using the same isotropic etching process or different isotropic etching processes.

Figure 2E:
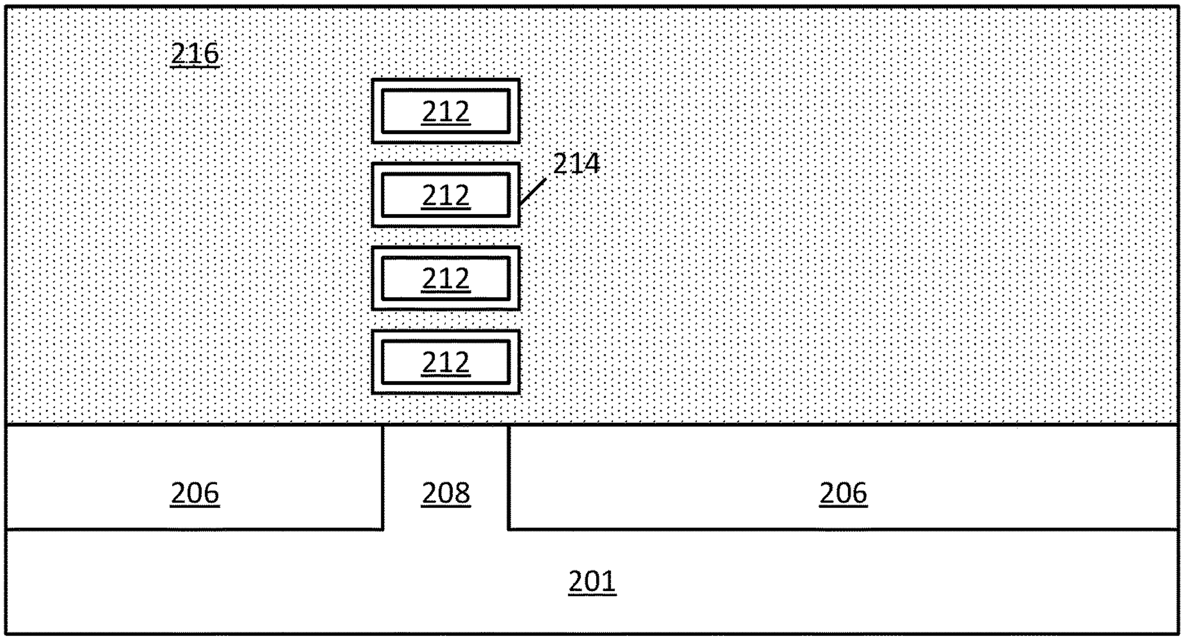

FIG. 2E depicts the cross-section view of the structure shown in FIG. 2D following the formation of a gate structure and subsequent polishing, according to some embodiments. The gate structure includes a gate dielectric 214 and a conductive gate electrode 216. Gate dielectric 214 may be first formed around nanoribbons 212 prior to the formation of gate electrode 216. The gate dielectric 214 may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 214 includes a layer of hafnium oxide with a thickness between about 1 nm and about 5 nm. In some embodiments, gate dielectric 214 may include one or more silicates (e.g., titanium silicate, tungsten silicate, niobium silicate, and silicates of other transition metals). In some cases, gate dielectric 214 may include a first layer on nanoribbons 212, and a second layer on the first layer. The first layer can be, for instance, an oxide of the semiconductor material of nanoribbons 212 (e.g., silicon dioxide) and the second layer can be a high-k dielectric material (e.g., hafnium oxide). More generally, gate dielectric 214 can include any number of dielectric layers. According to some embodiments, gate dielectric 214 forms along all surfaces exposed within the gate trench, such as along inner sidewalls of the spacer structures and along the top surfaces of dielectric fill 206 and subfin regions 208.

As noted above, gate electrode 216 can represent any number of conductive layers. The conductive gate electrode 216 may be deposited using electroplating, electroless plating, CVD, PECVD, ALD, or PVD, to name a few examples. In some embodiments, gate electrode 216 includes doped polysilicon, a metal, or a metal alloy. Example suitable metals or metal alloys include aluminum, tungsten, cobalt, molybdenum, ruthenium, titanium, tantalum, copper, and carbides and nitrides thereof. Gate electrode 216 may include, for instance, a metal fill material along with one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates. Following the formation of the gate structure, the entire structure may be polished or planarized such that the top surface of the gate structure (e.g., top surface of gate electrode 216) is planar with the top surface of other semiconductor elements, such as the spacer structures that define the gate trench.

Figure 2F:
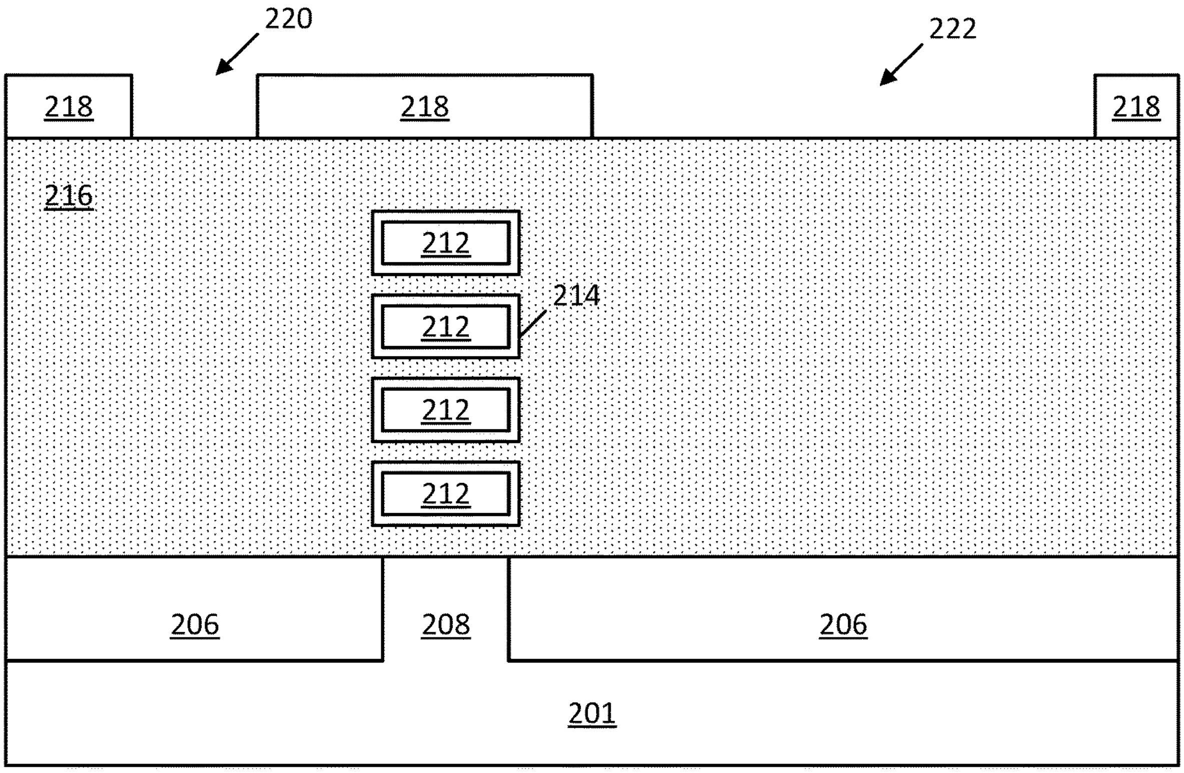

FIG. 2F illustrates another cross-section view of the structure shown in FIG. 2E following the formation of a masking structure 218, according to some embodiments. In some examples, a dielectric gate cap may be formed on the top surface of gate electrode 216 prior to masking structure 218.

Masking structure 218 may include any number of hard mask layers, such as any dielectric layers or carbon hard mask layers. A first opening 220 and a second opening 222 may be formed through masking structure 218 (and through any other dielectric layers that are present) to expose a portion of gate electrode 216 where gate cuts will be formed. A reactive ion etching (RIE) process may be used to form both first opening 220 and second opening 222, in some examples. According to some embodiments, first opening 220 defines a location for a narrow gate cut and has as first width and second opening defines a location for a wide gate cut and has a second width greater than the first width. For example, the first width may be between about 10 nm and about 30 nm and the second width may be between about 180 nm and about 260 nm. More generally, the first and second widths may be any distances suitable for a given application, where the first width is at least two-times larger than the second width.

Figure 2G:
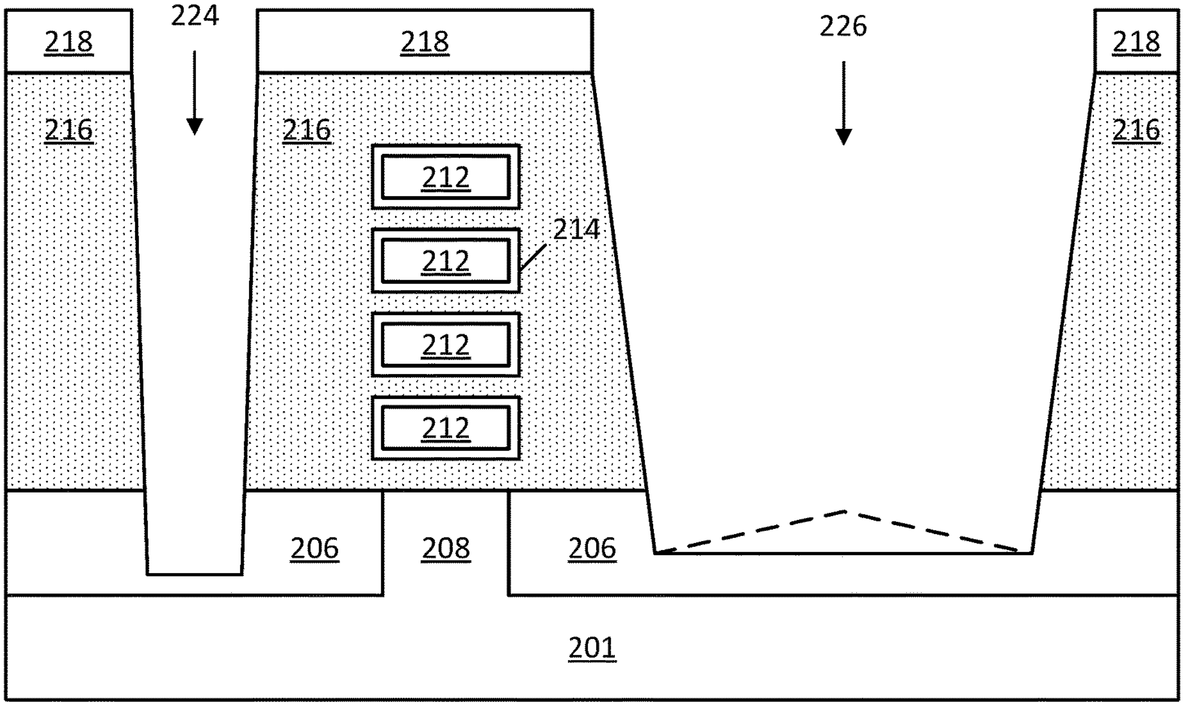

FIG. 2G illustrates another cross-section view of the structure shown in FIG. 2F following the formation of a narrow gate cut recess 224 and a wide gate cut recess 226 through at least an entire thickness of gate electrode 216, according to some embodiments. Narrow gate cut recess 224 may have a high height-to-width ratio such as between 5:1 and 8:1 and may be formed via a series of RIE and passivation steps to etch through the conductive material of gate electrode 216. Narrow gate cut recess 224 may be tapered and have a largest width along a top surface of gate electrode 216 between about 10 nm and about 30 nm. Wide gate cut recess 226 may have a low height-to-width ratio such as between 1:1 and 3:1 and may be formed via one or more RIE steps with or without passivation steps to etch through the conductive material of gate electrode 216. Wide gate cut recess 226 may be tapered and have a largest width along a top surface of gate electrode 216 between about 180 nm and about 260 nm. In some embodiments, either or both of narrow gate cut recess 224 and wide gate cut recess 226 extends through an entire thickness of dielectric fill 206 and into the underlying substrate 201. It should be understood that the bottom surface of wide gate cut recess 226 may not be level due to the etching process as it progresses from gate electrode 216 to dielectric fill 206. For example, the bottom surface of wide gate cut recess 226 may rise in the center as shown by the dashed line. The surface topography at the bottom of wide gate cut recess 226 does not matter so long as wide gate cut recess 226 extends through the entire thickness of gate electrode 216.

Figure 2H:
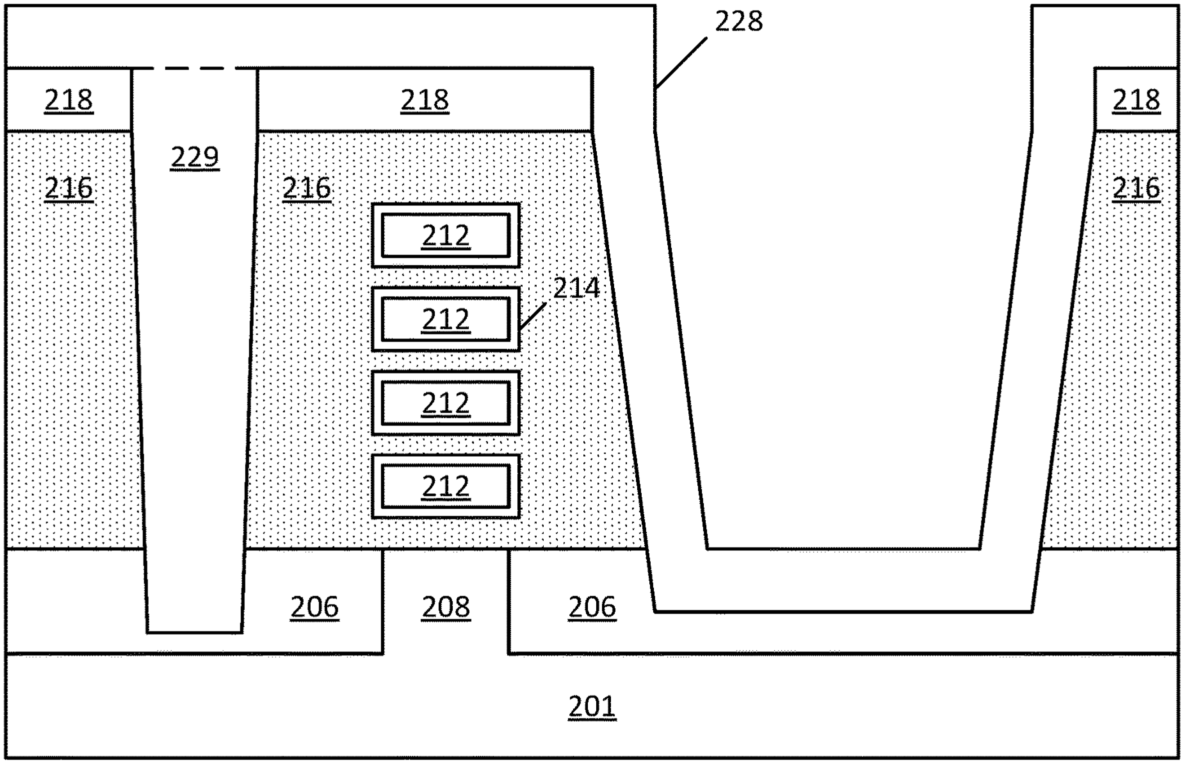

FIG. 2H illustrates another cross-section view of the structure shown in FIG. 2G following the formation of a first dielectric layer 228 within both narrow gate cut recess 224 and wide gate cut recess 226, according to some embodiments. First dielectric layer 228 may include a high-k dielectric material, such as silicon nitride or any other material having a dielectric constant of at least 6.5. First dielectric layer 228 may be conformally deposited using atomic layer deposition (ALD) to a thickness, for example, between about 50 nm and about 80 nm. Due to the relatively narrow width of narrow gate cut recess 224, first dielectric layer 228 may substantially fill narrow gate cut recess 224 to complete formation of a narrow gate cut 229. In some examples, a void or seam may exist along a central axis of narrow gate cut 229 due to the formation of the dielectric material from the outside-in.

Figure 2I:
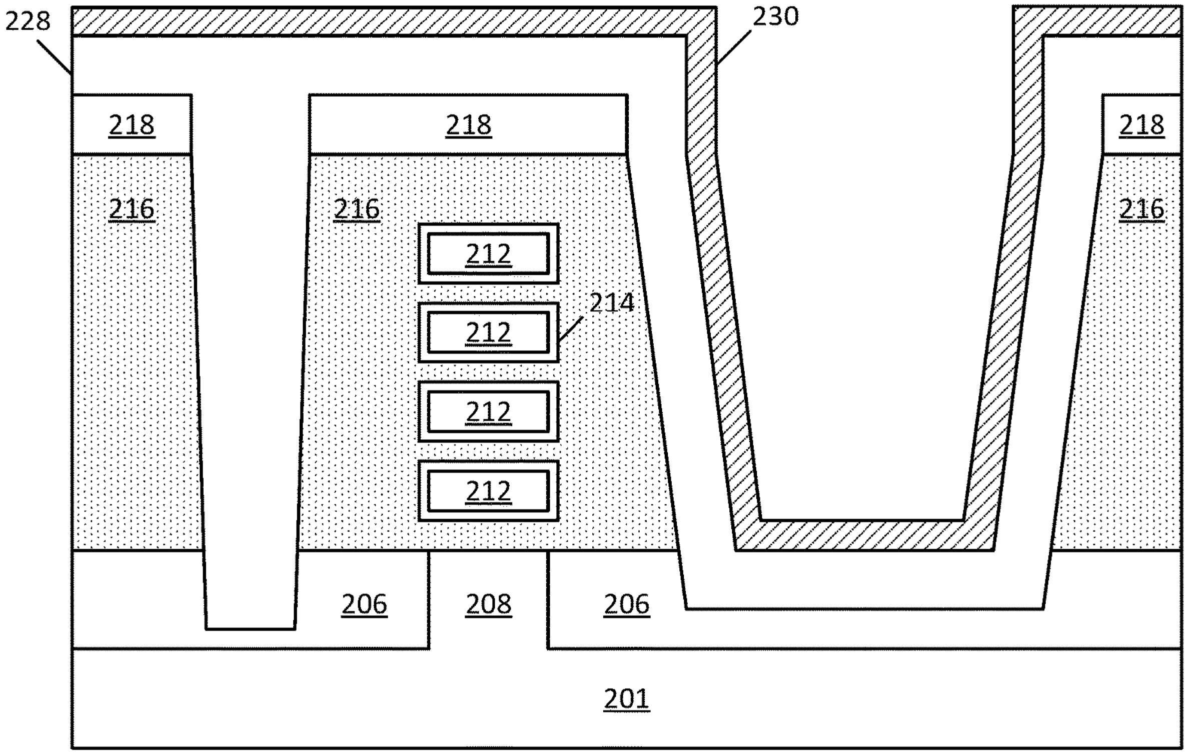

FIG. 2I illustrates another cross-section view of the structure shown in FIG. 2H following the formation of a second dielectric layer 230 on first dielectric layer 228 within wide gate cut recess 226, according to some embodiments. Second dielectric layer 230 may be formed using CVD to produce a conformal layer with a thickness, for example, between about 10 nm and about 30 nm, or a thickness that is less than about 30 nm. According to some embodiments, second dielectric layer 230 includes a different material composition compared to first dielectric layer 228. In some examples, second dielectric layer 230 includes silicon carbide or any other suitable high-k material having a dielectric constant of at least 6.5.

Figure 2J:
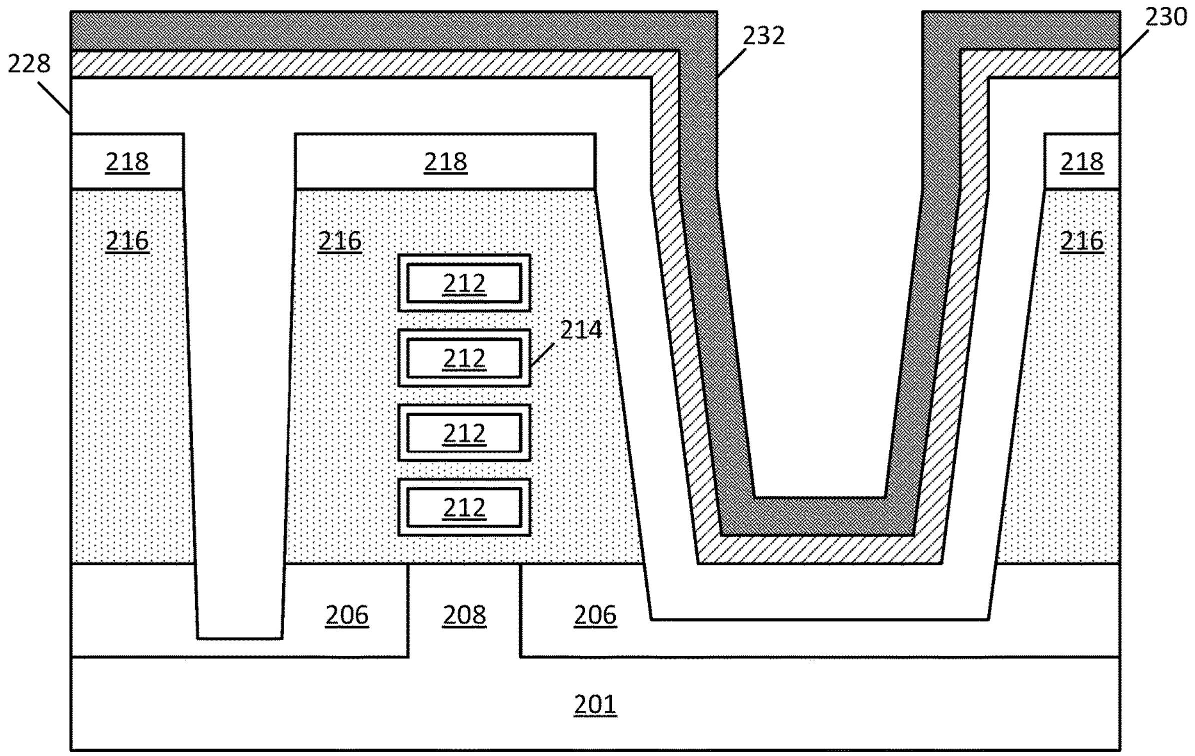

FIG. 2J illustrates another cross-section view of the structure shown in FIG. 2I following the formation of a third dielectric layer 232 on second dielectric layer 230 within wide gate cut recess 226, according to some embodiments. Third dielectric layer 232 may be formed using a flowable CVD process to produce a relatively dense conformal layer with a thickness between, for example, about 40 nm and about 60 nm. According to some embodiments, a CVD process using a high density plasma (e.g., a plasma density higher than that used during the CVD process to form second dielectric layer 230) along with a precursor material and a thermal anneal step is used to form a very dense layer of dielectric material. As a result, third dielectric layer 232 may have the same material composition as second dielectric layer 230 (e.g., silicon carbide), but a greater density. Third dielectric layer 232 may exhibit fewer voids or seams compared to second dielectric layer 230 owing to its higher density.

Figure 2K:
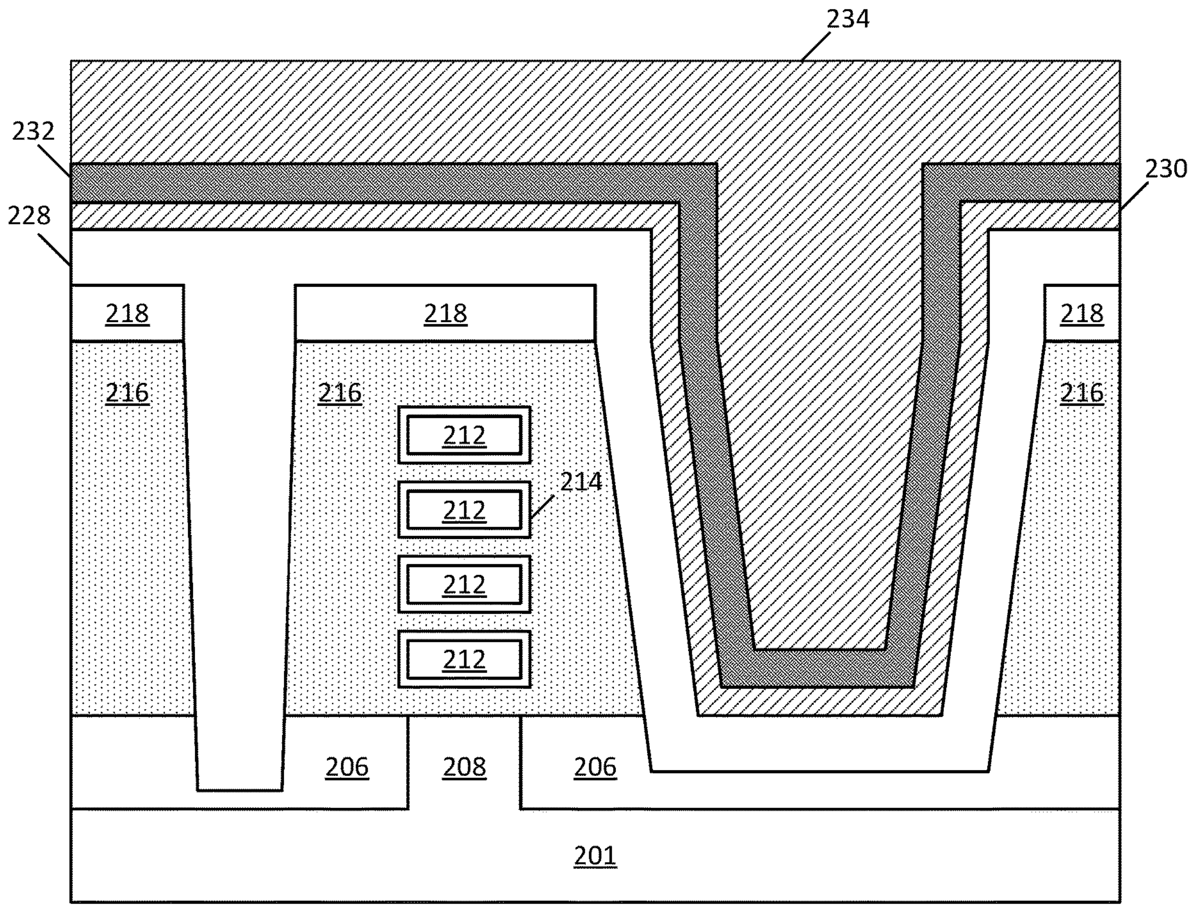

FIG. 2K illustrates another cross-section view of the structure shown in FIG. 2J following the formation of a dielectric fill 234 within a remaining volume of wide gate cut recess 226 and on third dielectric layer 232, according to some embodiments. Dielectric fill 234 may have the same material composition as each of second dielectric layer 230 and third dielectric layer 232 (e.g., silicon carbide), and may be formed using CVD. Dielectric fill 234 may be formed to any height to ensure complete coverage within the remaining volume of wide gate cut recess 226.

Figure 2L:
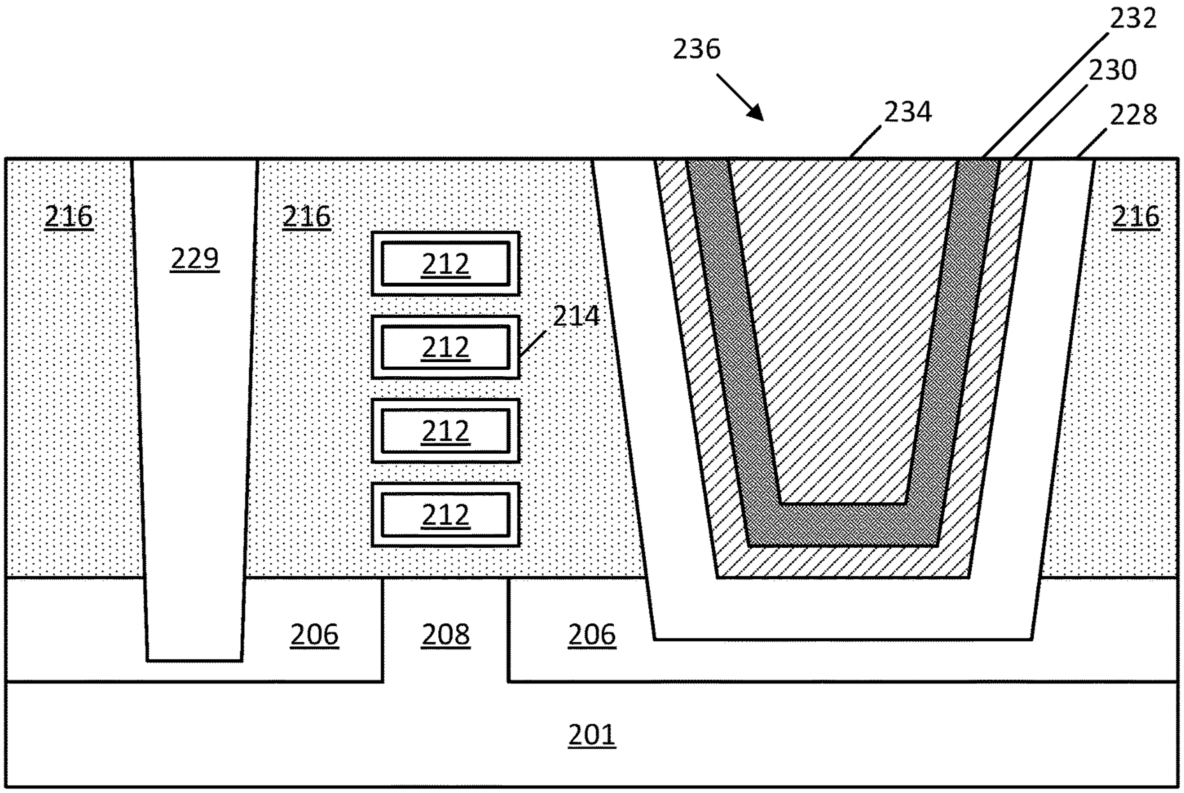

FIG. 2L illustrates another cross-section view of the structure shown in FIG. 2K following the removal of one or more dielectric layers from the top of the structure to yield a final narrow gate cut 229 and wide gate cut 236 each having a top surface substantially coplanar with a top surface of gate electrode 216 (or with a dielectric gate cap on gate electrode 216), according to some embodiments. One or more CMP steps may be used to remove any number of various dielectric layers until the top surface of gate electrode 216 (or a dielectric gate cap on gate electrode 216) is reached. Following the polishing, wide gate cut 236 includes a multi-layer dielectric stack. Because dielectric fill 234 occupies a relatively smaller volume of the overall wide gate cut 236 due to the presence of the other dielectric layers, little to no drooping is observed at the top surface of dielectric fill 234. Because both narrow gate cut 229 and wide gate cut 236 are formed through the gate structure (rather than being formed before it), gate dielectric 214 does not extend up any sidewall of narrow gate cut 229 or wide gate cut 236.

Figure 3:
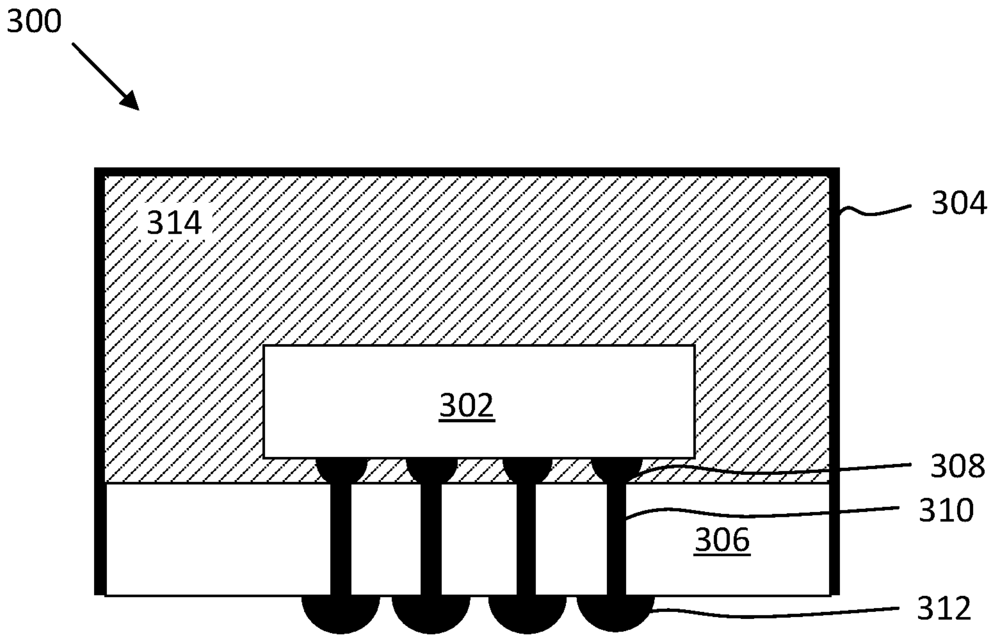
FIG. 3 illustrates a cross-sectional view of a chip package containing one or more semiconductor dies, in accordance with some embodiments of the present disclosure.

FIG. 3 illustrates an example embodiment of a chip package 300, in accordance with an embodiment of the present disclosure. As can be seen, chip package 300 includes one or more dies 302. One or more dies 302 may include at least one integrated circuit having semiconductor devices, such as any of the semiconductor devices disclosed herein. One or more dies 302 may include any other circuitry used to interface with other devices formed on the dies, or other devices connected to chip package 300, in some example configurations.

As can be further seen, chip package 300 includes a housing 304 that is bonded to a package substrate 306. The housing 304 may be any standard or proprietary housing, and may provide, for example, electromagnetic shielding and environmental protection for the components of chip package 300. The one or more dies 302 may be conductively coupled to a package substrate 306 using connections 308, which may be implemented with any number of standard or proprietary connection mechanisms, such as solder bumps, ball grid array (BGA), pins, or wire bonds, to name a few examples. Package substrate 306 may be any standard or proprietary package substrate, but in some cases includes a dielectric material having conductive pathways (e.g., including conductive vias and lines) extending through the dielectric material between the faces of package substrate 306, or between different locations on each face. In some embodiments, package substrate 306 may have a thickness less than 1 millimeter (e.g., between 0.1 millimeters and 0.5 millimeters), although any number of package geometries can be used. Additional conductive contacts 312 may be disposed at an opposite face of package substrate 306 for conductively contacting, for instance, a printed circuit board (PCB). One or more vias 310 extend through a thickness of package substrate 306 to provide conductive pathways between one or more of connections 308 to one or more of contacts 312. Vias 310 are illustrated as single straight columns through package substrate 306 for ease of illustration, although other configurations can be used (e.g., damascene, dual damascene, through-silicon via, or an interconnect structure that meanders through the thickness of substrate 306 to contact one or more intermediate locations therein). In still other embodiments, vias 310 are fabricated by multiple smaller stacked vias, or are staggered at different locations across package substrate 306. In the illustrated embodiment, contacts 312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 312, to inhibit shorting.

In some embodiments, a mold material 314 may be disposed around the one or more dies 302 included within housing 304 (e.g., between dies 302 and package substrate 306 as an underfill material, as well as between dies 302 and housing 304 as an overfill material). Although the dimensions and qualities of the mold material 314 can vary from one embodiment to the next, in some embodiments, a thickness of mold material 314 is less than 1 millimeter. Example materials that may be used for mold material 314 include epoxy mold materials, as suitable. In some cases, the mold material 314 is thermally conductive, in addition to being electrically insulating.

Methodology

Figure 4:
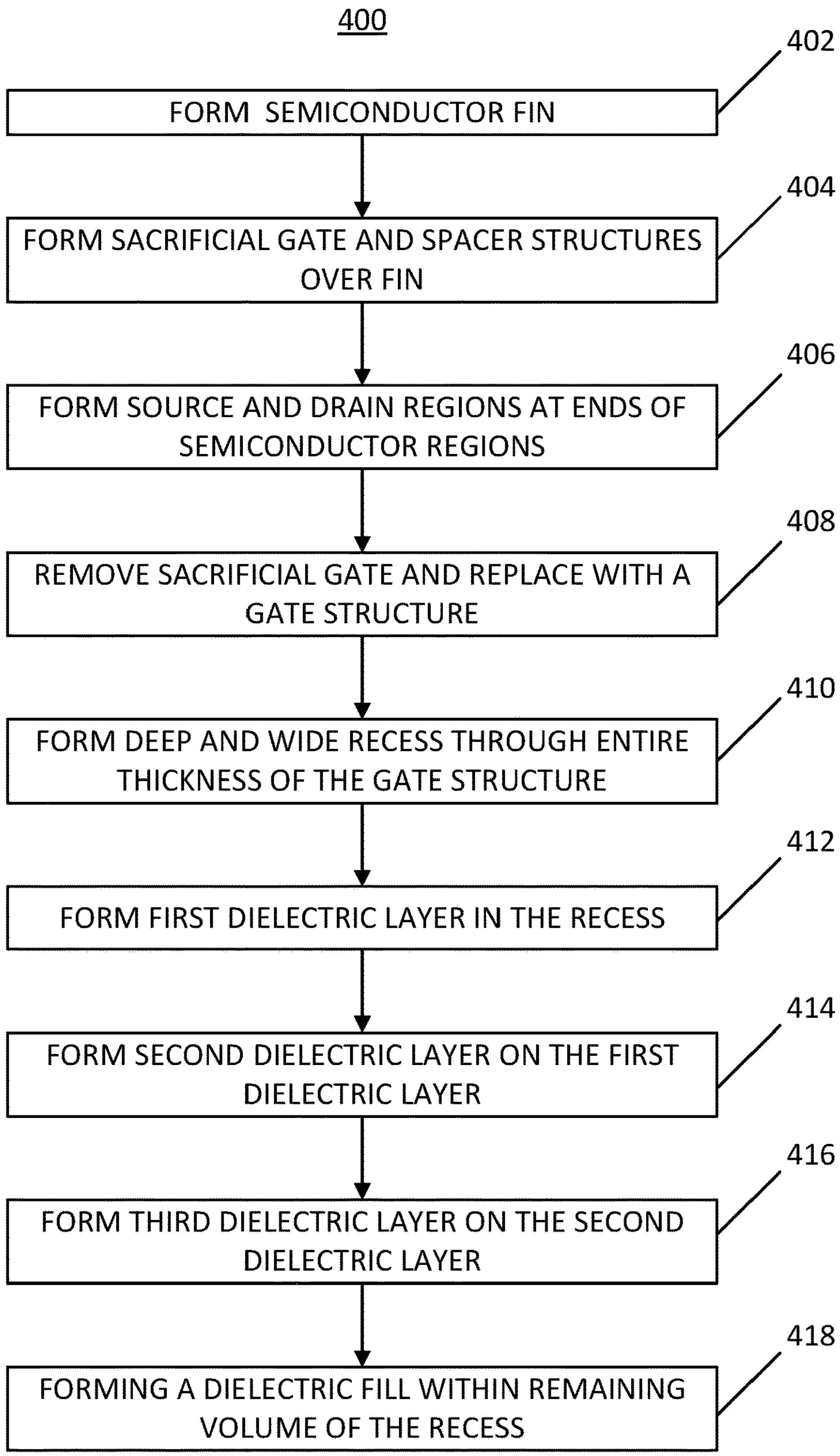
FIG. 4 is a flowchart of a fabrication process for semiconductor devices having a wide gate cut with a multi-layer dielectric structure, in accordance with an embodiment of the present disclosure.

FIG. 4 is a flow chart of a method 400 for forming at least a portion of an integrated circuit, according to an embodiment. Various operations of method 400 may be illustrated in FIGS. 2A-2L. However, the correlation of the various operations of method 400 to the specific components illustrated in the aforementioned figures is not intended to imply any structural and/or use limitations. Rather, the aforementioned figures provide one example embodiment of method 400. Other operations may be performed before, during, or after any of the operations of method 400. For example, method 400 does not explicitly describe all processes that are performed to form common transistor structures. Some of the operations of method 400 may be performed in a different order than the illustrated order.

Method 400 begins with operation 402 where one of any number of semiconductor fins is formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. The alternating layers can be blanket deposited and then etched into fins, or deposited into fin-shaped trenches. The fins may also include a cap structure over each fin that is used to define the locations of the fins during, for example, an RIE process. The cap structure may be a dielectric material, such as silicon nitride.

According to some embodiments, a dielectric layer is formed around subfin portions of the one or more fins. In some embodiments, the dielectric layer extends between each pair of adjacent parallel fins and runs lengthwise in the same direction as the fins. In some embodiments, the anisotropic etching process that forms the fins also etches into a portion of the substrate and the dielectric layer may be formed within the recessed portions of the substrate. Accordingly, the dielectric layer acts as shallow trench isolation (STI) between adjacent fins. The dielectric layer may be any suitable dielectric material, such as silicon dioxide.

Method 400 continues with operation 404 where a sacrificial gate and spacer structures are formed over the fin. The sacrificial gate may be patterned using a gate masking layer in a strip that runs orthogonally over the fin (many gate masking layers and corresponding sacrificial gates may be formed parallel to one another (e.g., forming a cross-hatch pattern with any number of fins). The gate masking layer may be any suitable hard mask material, such as CHM or silicon nitride. The sacrificial gate may be formed from any suitable material that can be selectively removed at a later time without damaging the semiconductor material of the fin. In one example, the sacrificial gate includes polysilicon. The spacer structures may be deposited and then etched back such that the spacer structures remain mostly only on sidewalls of any exposed structures. According to some embodiments, the spacer structures may be any suitable dielectric material, such as silicon nitride or silicon oxynitride.

Method 400 continues with operation 406 where source or drain regions are formed at the ends of the semiconductor region of the fin. Any portions of the fin not protected by the sacrificial gate and spacer structures may be removed using, for example, an anisotropic etching process followed by the epitaxial growth of the source or drain regions from the exposed ends of the semiconductor region of the fin. In some example embodiments, the source or drain regions are NMOS source or drain regions (e.g., epitaxial silicon) or PMOS source or drain regions (e.g., epitaxial SiGe). Another dielectric fill may be formed adjacent to the various source or drain regions for additional electrical isolation between adjacent regions. The dielectric fill may also extend over a top surface of the source or drain regions. In some embodiments, topside conductive contacts may be formed through the dielectric fill to contact one or more of the source or drain regions.

Method 400 continues with operation 408 where the sacrificial gate is removed and replaced with a gate structure. The sacrificial gate may be removed using an isotropic etching process that selectively removes all of the material from the sacrificial gate, thus exposing the fin between the set of spacer structures. In the example case where GAA transistors are used, any sacrificial layers within the exposed fin between the spacer structures may also be removed to release nanoribbons, nanosheets, or nanowires of semiconductor material.

The gate structure may include both a gate dielectric and a gate electrode. The gate dielectric is first formed over the exposed semiconductor region between the spacer structures followed by forming the gate electrode within the remainder of the trench between the spacer structures, according to some embodiments. The gate dielectric may include any number of dielectric layers deposited using a CVD process, such as ALD. The gate electrode can include any number of conductive material layers, such as any metals, metal alloys, or polysilicon. The gate electrode may be deposited using electroplating, electroless plating, CVD, ALD, PECVD, or PVD, to name a few examples.

Method 400 continues with operation 410 where a deep and wide recess is formed through an entire thickness of the gate structure. A mask structure may be formed over the gate structure and an opening may be formed through the mask structure to expose a portion of the underlying gate electrode. According to some embodiments, the opening through the mask structure is at a location where the recess is to be formed through the underlying gate electrode. The mask structure may include any number of hard mask layers, such as any dielectric layers or carbon hard mask layers. The opening may be formed using a directional RIE process. According to some embodiments, the recess has a height-to-width aspect ratio of between about 1:1 and 3:1 and extends through at least an entire thickness of the gate structure. In some examples, the recess also extends through an entire thickness of the dielectric fill between devices and into the underlying substrate.

Method 400 continues with operation 412 where a first dielectric layer is formed within the recess and on the exposed sidewalls of the gate electrode. According to some embodiments, the first dielectric layer may include a high-k dielectric material, such as silicon nitride or any other material having a dielectric constant of at least 6.5. The first dielectric layer may be deposited using atomic layer deposition (ALD) to a thickness between, for example, about 50 nm and about 80 nm.

Method 400 continues with operation 414 where a second dielectric layer is formed within the recess and on the first dielectric layer. The second dielectric layer may be formed using CVD to produce a layer with a thickness between, for example, about 10 nm and about 30 nm, or a thickness that is less than about 30 nm. According to some embodiments, the second dielectric layer includes a different material composition compared to the first dielectric layer. In some examples, the second dielectric layer includes silicon carbide while the first dielectric layer includes silicon nitride.

Method 400 continues with operation 416 where a third dielectric layer is formed within the recess and on the second dielectric layer. The third dielectric layer may be formed using a flowable CVD process to produce a relatively dense layer with a thickness between, for example, about 40 nm and about 60 nm, such as around 50 nm. According to some embodiments, a CVD process using a higher plasma density compared to the CVD process used to form the second dielectric layer is used to form a very dense layer of dielectric material. As a result, the third dielectric layer may have the same material composition as the second dielectric layer (e.g., silicon carbide), but a greater density compared to the second dielectric layer. The third dielectric layer may exhibit fewer voids or seams compared to the second dielectric layer owing to its higher density.

Method 400 continues with operation 418 where a dielectric fill is formed within a remaining volume of the recess and on the third dielectric layer. The dielectric fill may have the same material composition as each of the second dielectric layer and the third dielectric layer (e.g., silicon carbide), and may be formed using CVD. Following the formation of the dielectric fill, any number of CMP processes may be performed to remove all excess portions of the first dielectric layer, second dielectric layer, third dielectric layer, and dielectric fill outside of the recess.

Example System

Figure 5:
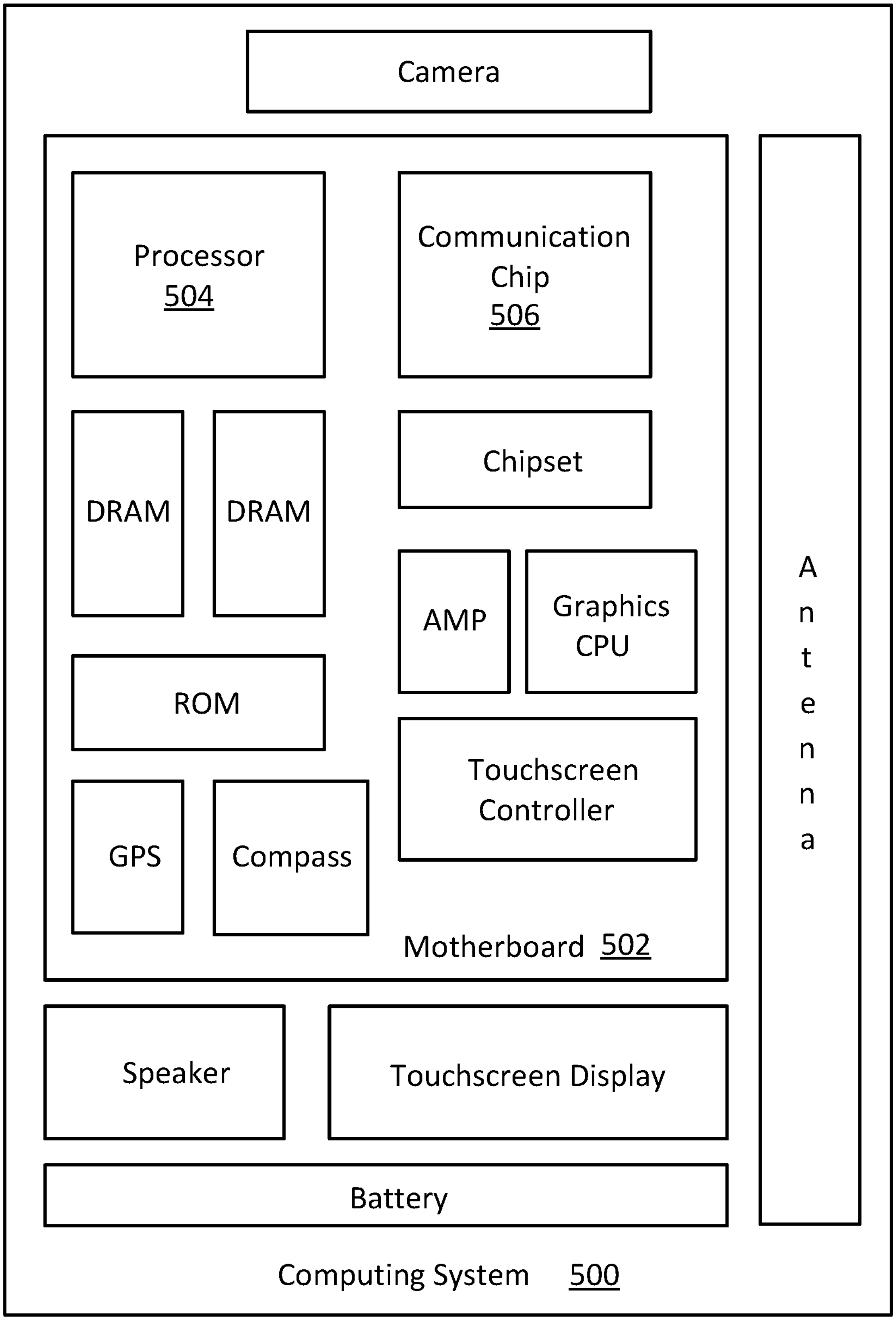
FIG. 5 illustrates a computing system including one or more integrated circuits, as variously described herein, in accordance with an embodiment of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board (PCB), whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment, such as a module including an integrated circuit on a substrate, the substrate having semiconductor devices and at least one wide gate cut having a multi-layer dielectric structure. In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing system 500 includes an integrated circuit die packaged within the processor 504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more semiconductor devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 500 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a semiconductor device having a semiconductor region extending in a first direction from a source region to a drain region, and a gate structure extending in a second direction over the semiconductor region, and a dielectric structure extending in a third direction through at least an entire thickness of the gate structure. The dielectric structure includes a first dielectric layer along edges of the dielectric structure, a second dielectric layer on the first dielectric layer, a third dielectric layer on the second dielectric layer, and a dielectric fill within a remaining volume of the dielectric structure and on the third dielectric layer. The first dielectric layer has a first material composition. The second dielectric layer has a second material composition elementally different from the first material composition. The third dielectric layer has a greater density than the second dielectric layer.

Example 2 includes the integrated circuit of Example 1, wherein the first dielectric layer directly contacts the gate structure.

Example 3 includes the integrated circuit of Example 1 or 2, wherein the first dielectric layer comprises silicon and nitrogen.

Example 4 includes the integrated circuit of any one of Examples 1-3, wherein the first dielectric layer has a thickness between about 50 nm and about 80 nm.

Example 5 includes the integrated circuit of any one of Examples 1-4, wherein the second dielectric layer has a thickness that is less than about 30 nm.

Example 6 includes the integrated circuit of any one of Examples 1-5, wherein the second dielectric layer comprises silicon and carbon.

Example 7 includes the integrated circuit of any one of Examples 1-6, wherein the third dielectric layer comprises silicon and carbon.

Example 8 includes the integrated circuit of any one of Examples 1-7, wherein the dielectric fill has the second material composition.

Example 9 includes the integrated circuit of any one of Examples 1-8, wherein the semiconductor region comprises a plurality of semiconductor nanoribbons.

Example 10 includes the integrated circuit of Example 9, wherein the plurality of semiconductor nanoribbons comprise germanium, silicon, or a combination thereof.

Example 11 includes the integrated circuit of any one of Examples 1-10, wherein the gate structure includes a gate dielectric around the semiconductor region.

Example 12 includes the integrated circuit of Example 11, wherein the gate dielectric is not present on any sidewall of the dielectric structure.

Example 13 includes the integrated circuit of any one of Examples 1-12, wherein the dielectric structure has a height-to-width aspect ratio between 1:1 and 3:1.

Example 14 is a printed circuit board that includes the integrated circuit of any one of Examples 1-13.

Example 15 is an electronic device that includes a chip package having one or more dies. At least one of the one or more dies includes a semiconductor device having a semiconductor region extending in a first direction from a source region to a drain region, and a gate structure extending in a second direction over the semiconductor region, and a dielectric structure extending in a third direction through at least an entire thickness of the gate structure. The dielectric structure includes a first dielectric layer along edges of the dielectric structure, a second dielectric layer on the first dielectric layer, a third dielectric layer on the second dielectric layer, and a dielectric fill within a remaining volume of the dielectric structure and on the third dielectric layer. The first dielectric layer has a first material composition. The second dielectric layer has a second material composition elementally different from the first material composition. The third dielectric layer has a greater density than the second dielectric layer.

Example 16 includes the electronic device of Example 15, wherein the first dielectric layer directly contacts the gate structure.

Example 17 includes the electronic device of Example 15 or 16, wherein the first dielectric layer comprises silicon and nitrogen.

Example 18 includes the electronic device of any one of Examples 15-17, wherein the first dielectric layer has a thickness between about 50 nm and about 80 nm.

Example 19 includes the electronic device of any one of Examples 15-18, wherein the second dielectric layer comprises silicon and carbon.

Example 20 includes the electronic device of any one of Examples 15-19, wherein the third dielectric layer comprises silicon and carbon.

Example 21 includes the electronic device of any one of Examples 15-20, wherein the second dielectric layer has a thickness that is less than about 30 nm.

Example 22 includes the electronic device of any one of Examples 15-21, wherein the dielectric fill has the second material composition.

Example 23 includes the electronic device of any one of Examples 15-22, wherein the semiconductor region comprises a plurality of semiconductor nanoribbons.

Example 24 includes the electronic device of Example 23, wherein the plurality of semiconductor nanoribbons comprise germanium, silicon, or a combination thereof.

Example 25 includes the electronic device of any one of Examples 15-24, wherein the gate structure includes a gate dielectric around the semiconductor region.

Example 26 includes the electronic device of Example 25, wherein the gate dielectric is not present on any sidewall of the dielectric structure.

Example 27 includes the electronic device of any one of Examples 15-26, wherein the dielectric structure has a height-to-width aspect ratio between 1:1 and 3:1.

Example 28 includes the electronic device of any one of Examples 15-27, further comprising a printed circuit board, wherein the chip package is coupled to the printed circuit board.

Example 29 is a method of forming an integrated circuit. The method includes forming a fin comprising semiconductor material, the fin extending above a substrate and extending in a first direction; forming a gate electrode extending over the semiconductor material in a second direction different from the first direction; forming a recess through an entire thickness of the gate electrode and adjacent to the fin; forming a first dielectric layer within the recess, the first dielectric layer having a first material composition; forming a second dielectric layer on the first dielectric layer, the second dielectric layer having a second material composition different from the first material composition; forming a third dielectric layer on the second dielectric layer, the third dielectric layer having a greater density than the second dielectric layer; and forming a dielectric fill within a remaining volume of the recess and on the third dielectric layer.

Example 30 includes the method of Example 29, further comprising forming source and drain regions at ends of the semiconductor material.

Example 31 includes the method of Example 29 or 30, further comprising polishing a top surface of at least the dielectric fill using chemical mechanical polishing (CMP).

Example 32 includes the method of any one of Examples 29-31, wherein forming the first dielectric layer comprises depositing the first dielectric layer using atomic layer deposition (ALD).

Example 33 includes the method of any one of Examples 29-32, wherein forming the second dielectric layer comprises depositing the second dielectric layer using chemical vapor deposition (CVD) and forming the dielectric fill comprises depositing the dielectric fill using CVD.

Example 34 includes the method of Example 33, wherein forming the third dielectric layer comprises depositing the third dielectric layer using CVD with a higher plasma density compared to the CVD process used to deposit the second dielectric layer and the CVD process used to deposit the dielectric fill.

Example 35 is an integrated circuit that includes one or more semiconductor regions extending in a first direction between corresponding source or drain regions, a gate structure extending in a second direction over the one or more semiconductor regions, a gate cut extending in a third direction through at least an entire thickness of the gate structure, and a dielectric structure extending in the third direction through at least the entire thickness of the gate structure. The gate cut has a first width at a top surface of the gate cut and the dielectric structure has a second width at a top surface of the dielectric structure that is greater than the first width. The dielectric structure includes a first dielectric layer along edges of the dielectric structure, a second dielectric layer on the first dielectric layer, a third dielectric layer on the second dielectric layer, and a dielectric fill within a remaining volume of the dielectric structure and on the third dielectric layer. The third dielectric layer has a greater density compared to both the second dielectric layer and the dielectric fill.

Example 36 includes the integrated circuit of Example 35, wherein the first dielectric layer directly contacts the gate structure.

Example 37 includes the integrated circuit of Example 35 or 36, wherein the first dielectric layer comprises silicon and nitrogen.

Example 38 includes the integrated circuit of any one of Examples 35-37, wherein the first dielectric layer has a thickness between about 50 nm and about 80 nm.

Example 39 includes the integrated circuit of any one of Examples 35-38, wherein the second dielectric layer comprises silicon and carbon.

Example 40 includes the integrated circuit of any one of Examples 35-39, wherein the third dielectric layer comprises silicon and carbon.

Example 41 includes the integrated circuit of any one of Examples 35-40, wherein the dielectric fill comprises silicon and carbon.

Example 42 includes the integrated circuit of any one of Examples 35-41, wherein the second dielectric layer has a thickness that is less than about 30 nm.

Example 43 includes the integrated circuit of any one of Examples 35-42, wherein the gate structure includes a gate dielectric around the semiconductor region.

Example 44 includes the integrated circuit of Example 43, wherein the gate dielectric is not present on any sidewall of the dielectric structure.

Example 45 includes the integrated circuit of any one of Examples 35-44, wherein the second width is at least six times greater than the first width.

Example 46 includes the integrated circuit of any one of Examples 35-45, wherein the dielectric structure has a height-to-width aspect ratio between 1:1 and 3:1.

Example 47 is a printed circuit board having the integrated circuit of any one of Examples 35-46.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

a semiconductor device having a semiconductor region extending in a first direction from a source region to a drain region, and a gate structure extending in a second direction over the semiconductor region; and a dielectric structure extending in a third direction through at least an entire thickness of the gate structure, the dielectric structure comprising a first dielectric layer along edges of the dielectric structure, the first dielectric layer having inner side surfaces, a bottom surface, and a first material composition, a second dielectric layer conformally on the inner side surfaces and the bottom surface of the first dielectric layer, the second dielectric layer having inner side surfaces, a bottom surface, and a second material composition elementally different from the first material composition, a third dielectric layer conformally on the inner side surfaces and the bottom surface of the second dielectric layer, the third dielectric layer having inner side surfaces and a bottom surface, and having a greater density than the second dielectric layer, and a dielectric fill within a remaining volume of the dielectric structure and on the inner side surfaces and the bottom surface of the third dielectric layer.

2. The integrated circuit of claim 1, wherein the first dielectric layer directly contacts the gate structure.

3. The integrated circuit of claim 1, wherein the first dielectric layer comprises silicon and nitrogen.

4. The integrated circuit of claim 1, wherein the second dielectric layer comprises silicon and carbon and the third dielectric layer comprises silicon and carbon.

5. The integrated circuit of claim 4, wherein the dielectric fill has the second material composition.

6. The integrated circuit of claim 1, wherein the gate structure includes a gate dielectric around the semiconductor region and the gate dielectric is not present on any sidewall of the dielectric structure.

7. The integrated circuit of claim 1, wherein the dielectric structure has a height-to-width aspect ratio between 1:1 and 3:1.

8. A printed circuit board comprising the integrated circuit of claim 1.

9. An electronic device, comprising:

a chip package comprising one or more dies, at least one of the one or more dies comprising a semiconductor device having a semiconductor region extending in a first direction between a source region and a drain region, and a gate structure extending in a second direction over the semiconductor region; and a dielectric structure extending in a third direction through at least an entire thickness of the gate structure, the dielectric structure comprising a first dielectric layer along edges of the dielectric structure, the first dielectric layer having inner side surfaces, a bottom surface, and a first material composition, a second dielectric layer directly on the inner side surfaces and the bottom surface of the first dielectric layer, the second dielectric layer having inner side surfaces, a bottom surface, and a second material composition different from the first material composition, a third dielectric layer directly on the inner side surfaces and the bottom surface of the second dielectric layer, the third dielectric layer having inner side surfaces and a bottom surface, and having a greater density than the second dielectric layer, and a dielectric fill within a remaining volume of the dielectric structure and directly on the inner side surfaces and the bottom surface of the third dielectric layer.

10. The electronic device of claim 9, wherein the first dielectric layer directly contacts the gate structure.

11. The electronic device of claim 9, wherein the first dielectric layer comprises silicon and nitrogen.

12. The electronic device of claim 9, wherein the second dielectric layer comprises silicon and carbon and the third dielectric layer comprises silicon and carbon.

13. The electronic device of claim 9, wherein the dielectric structure has a height-to-width aspect ratio between 1:1 and 3:1.

14. An integrated circuit comprising:

one or more semiconductor regions extending in a first direction between corresponding source or drain regions;

a gate structure extending in a second direction over the one or more semiconductor regions;

a gate cut extending in a third direction through at least an entire thickness of the gate structure, the gate cut having a first width at a top surface of the gate cut, wherein the gate cut has a same dielectric material across an entire width of the gate cut and along an entire height of the gate cut; and a dielectric structure extending in the third direction through at least the entire thickness of the gate structure, the dielectric structure having a second width at a top surface of the dielectric structure that is greater than the first width, wherein the dielectric structure comprises a first dielectric layer along edges of the dielectric structure, the first dielectric layer having the same dielectric material as the gate cut, a second dielectric layer on the first dielectric layer, a third dielectric layer on the second dielectric layer, and a dielectric fill within a remaining volume of the dielectric structure and on the third dielectric layer, wherein the third dielectric layer has a greater density compared to both the second dielectric layer and the dielectric fill.

15. The integrated circuit of claim 14, wherein the first dielectric layer directly contacts the gate structure.

16. The integrated circuit of claim 14, wherein the first dielectric layer comprises silicon and nitrogen.

17. The integrated circuit of claim 14, wherein the second dielectric layer comprises silicon and carbon and the third dielectric layer comprises silicon and carbon.

18. The integrated circuit of claim 17, wherein the dielectric fill comprises silicon and carbon.

19. The integrated circuit of claim 14, wherein the second width is at least six times greater than the first width.

20. The integrated circuit of claim 14, wherein the dielectric structure has a height-to-width aspect ratio between 1:1 and 3:1.

* * * * *